United States Patent [19]
Ciraula et al.

[11] Patent Number: 5,757,205
[45] Date of Patent: May 26, 1998

[54] POWER-SAVING DYNAMIC CIRCUIT

[75] Inventors: Michael Kevin Ciraula, Round Rock; Donald George Mikan, Jr., Austin, both of Tex.

[73] Assignee: International Business Machines Corporation, Armonk, N.Y.

[21] Appl. No.: 684,665

[22] Filed: Jul. 22, 1996

[51] Int. Cl.$^6$ ............................................. H03K 19/096
[52] U.S. Cl. .................................. 326/21; 326/95; 326/96
[58] Field of Search ................................ 326/21, 95, 96; 365/226, 227

[56] References Cited

U.S. PATENT DOCUMENTS 5,477,164  12/1995  Denker ................................. 326/21
5,614,847  3/1997  Kawahara et al. ...................... 326/98

*Primary Examiner*—Viet Q. Nguyen
*Attorney, Agent, or Firm*—Jenkens & Gilchrist; Raymond M. Galasso; Anthony V. S. England

[57] ABSTRACT

A dynamic switching circuit for use in a domino circuit array is disclosed. The dynamic switching circuit includes a charge-saving transistor for preventing charge stored on the dynamic circuit's output node from discharging to ground. The charge stored on the output node is then fed back to a precharge control transistor to charge the dynamic node during the subsequent precharge/evaluate cycle.

10 Claims, 2 Drawing Sheets

POWER-SAVING DYNAMIC CIRCUIT

FIELD OF THE INVENTION

This invention relates to dynamic switching circuits designed to save the amount of power consumed during precharging of the dynamic node.

BACKGROUND OF THE INVENTION

Dynamic switching circuits are designed to operate in two phases, a precharged phase and an evaluate phase. During the precharge phase, nodes within the dynamic circuit are set to predefined voltage levels. During the evaluate phase, the dynamic circuit nodes switch from their precharge state depending on the logic function of the dynamic switching circuit. Dynamic switching circuits are often cascaded together such that the output of one dynamic circuit becomes the input to the logic function of a second dynamic circuit. Each dynamic circuit is precharged in parallel, i.e., at the same time. However, each dynamic circuit evaluates in series. Dynamic circuits cascaded in this fashion are sometimes referred to as domino circuits in that the precharge sets up each dynamic circuit and a first dynamic circuit evaluation sets off a series of evaluations in each succeeding dynamic circuit until a final output is received.

A state of the art dynamic circuit used in such a domino circuit is depicted in FIG. 1. As shown in FIG. 1, each dynamic circuit 10 of a domino circuit requires a precharge input 12 and a logic signal input 14. A precharge control transistor 16 having an on state and an off state is operably coupled to a power supply 17 and a dynamic node 18. Dynamic node 18 is often referred to as a treetop node. Precharge input 12 receives a precharge signal for initiating the precharge phase and controlling charging of dynamic node 18 by setting precharge control transistor 16 into the on state wherein dynamic node 18 is charged by power supply 17. In this manner, precharge control transistor 16 controls charging of dynamic node 18 to a predefined voltage level based upon precharge input 12. Logic signal input 14 receives a logic signal for initiating the evaluate phase and controlling discharge of dynamic node 18. Dynamic circuit 10 further includes a combinational logic circuit 20 operably coupled to dynamic node 18 and ground 19 for controlling the discharge of the voltage from dynamic node 18 to ground 19 based upon the logic signal received by logic signal input 14. In other words, the logic signal either causes or doesn't cause combinational logic 20 to create a path from dynamic node 18 to ground 19. If a path to ground 19 is established from dynamic node 18, then dynamic node 18 discharges to ground 19 which causes dynamic node 18 to assume a low state. If, on the other hand, no path to ground 19 is established through combinational logic 20, then dynamic node 18 retains a high state.

Dynamic circuit 10 further includes a recharge transistor 22 having a conducting state and a non-conducting state and is coupled to power supply 17 and dynamic node 18 for maintaining the voltage at dynamic node 18 at the predefined voltage level. Recharge transistor 22 includes a recharge control input or gate 23 for receiving a recharge control signal that controls recharging of dynamic node 18 by setting recharge transistor 22 into the conducting state wherein dynamic node 18 is recharged by power supply 17. Recharge transistor 22 is used to maintain dynamic node 18 at the predefined voltage level between the start of the precharge phase and the end of the evaluate phase. As will be appreciated, recharge transistor 22 may not be necessary if the time between the start of the precharge phase and the end of the evaluate phase is short. In other words, dynamic node 18 does not have time to leak. Dynamic circuit 10 further comprises an inverter 24 operably coupled to dynamic node 18 and an output node 32. Inverter 24 includes a first transistor 26 and a second transistor 28 configured to form a standard two-transistor inverter as is well known in the art. Output node 32 is directly coupled to recharge control input 23 for delivering the recharge control signal, or voltage at output node 32, to recharge transistor 22. In other words, the voltage at output node 32, is fed back to recharge control input 23 so that recharge transistor 22 is set into its conducting state as the voltage at output node 32 drops. In this manner, dynamic node 18 is recharged by power supply 17. Dynamic circuit 10 may also include a ground interrupt transistor 30 coupled to combinational logic circuit 20 and ground 19 to ensure that no conductive path exists from power supply 17 to ground 19 during the precharge phase. It is well known in the art that ground interrupt transistor 30 can be eliminated if the logic signals fall to ground prior to precharge transistor 16 receiving the precharge signal from precharge input 12.

One of the disadvantages of using a dynamic switching circuit, such as depicted in FIG. 1, is that it consumes more power than a static switching circuit. In fact, power is consumed at every cycle consisting of the precharge phase and evaluate phase. What is needed is a dynamic circuit that saves the power used to precharge the dynamic node for use in a subsequent cycle consisting of another precharge phase and evaluate phase.

SUMMARY OF THE INVENTION

Accordingly, the present invention is directed to a dynamic switching circuit comprising: a precharge control transistor having an on state and an off state and operably coupled to a power supply and a dynamic node for selectively charging the dynamic node to a predefined voltage level, the precharge control transistor including a precharge input for receiving a precharge signal that controls charging of the dynamic node by setting the precharge control transistor into the on state wherein the dynamic node is charged by the power supply; combinational logic circuit operably coupled to the dynamic node and ground for controlling discharge of the voltage from the dynamic node to ground, the combinational logic circuit including a logic signal input for receiving a logic signal that controls discharge of the dynamic node; an inverter operably coupled to the dynamic node and an output node; a charge-saving transistor having an on state and an off state and operably coupled to the inverter and to ground for preventing charge stored on the output node from discharging to ground; and wherein the output node is coupled to the precharge control transistor such that charge stored on the output node is fed back to the dynamic node when the precharge control transistor is set into the on state by the precharge input signal.

The present invention is also directed to a dynamic switching circuit that includes a charge-assist transistor having an on state and an off state and operably coupled to the power supply and the dynamic node for assisting the precharge control transistor with charging of the dynamic node.

The primary advantage of the present invention is that it reduces energy consumption as compared to prior art dynamic switching circuits such as those found in a domino circuit array.

DETAILED DESCRIPTION OF A PREFERRED EMBODIMENT OF THE INTENTION

Generally, the present invention provides a dynamic switching circuit which reduces power consumption by saving the charge stored on the output node for use in subsequent precharging of the dynamic node. A prior art dynamic switching circuit has been described above in the background of the invention section herein.

Figure 1:
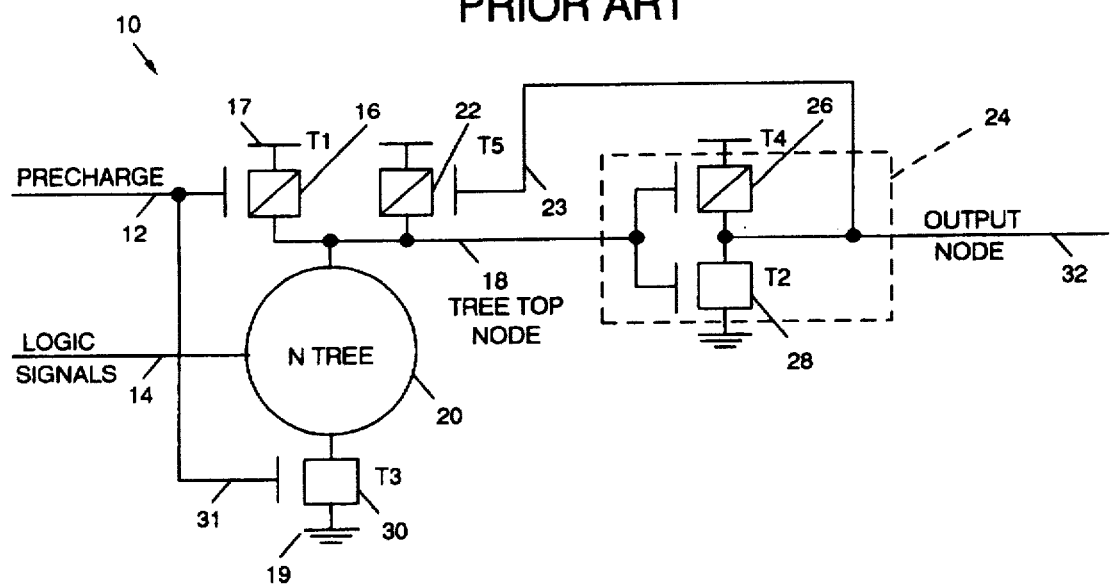
FIG. 1 is a circuit diagram of a prior art dynamic switching circuit.
Figure 2:
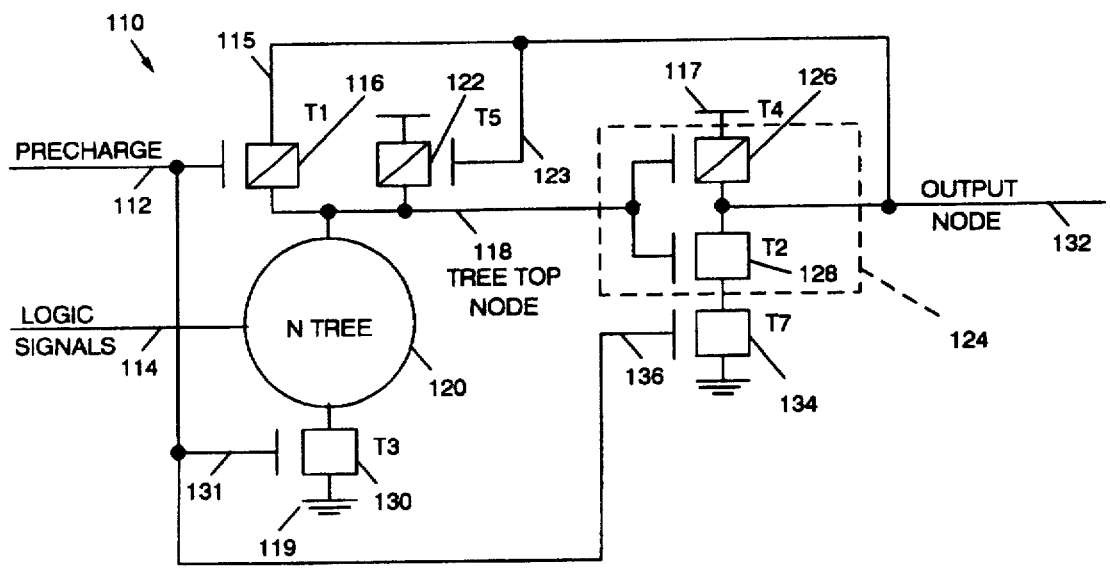
FIG. 2 is a circuit diagram of a dynamic switching circuit according to the present invention.

Referring now to FIG. 2, a dynamic switching circuit 110, in accordance with the present invention, will be described. The reference numerals used in FIG. 2 which are like or similar to the reference numerals used in FIG. 1 are intended to indicate like or similar components. A precharge control transistor 116 having an on state and an off state is operably coupled to a dynamic node 118. Precharge control transistor 116 includes a precharge input or gate 112 for receiving a precharge signal that controls charging of dynamic node 118 to a predefined voltage level by setting precharge control transistor 116 into the on state wherein dynamic node 118 is charged. A combinational logic circuit 120 is operably coupled to dynamic node 118 and ground 119 for controlling the discharge of the voltage from dynamic node 118 to ground 119. Combinational logic circuit 120 includes a logic signal input 114 for receiving a logic signal that controls discharge of dynamic node 118. A recharge transistor 122 having a conducting state and a non-conducting state is operably coupled to a power supply 117 and dynamic node 118 for maintaining the voltage at dynamic node 118 at the predefined voltage level. Recharge transistor 122 includes a recharge control input or gate 123 for receiving a recharge control signal that controls recharging of dynamic node 118 by setting recharge transistor 122 into the conducting state wherein dynamic node 118 is recharged by power supply 117. An inverter 124 is operably coupled to dynamic node 118, power supply 117, and an output node 132. Inverter 124 includes a first transistor 126 and a second transistor 128 configured to form a standard two-transistor inverter as is well known in the art. A ground interrupt transistor 130 is coupled to combinational logic circuit 120 and to ground 119 and includes a gate 131 directly coupled to precharge input 112 for receiving the precharge signal to ensure that no conductive path exists from power supply 117 to ground 119 during the precharge phase, thereby causing the precharge control transistor 116 to assume its on state wherein dynamic node 118 is charged. It is to be noted that ground interrupt transistor 130 may not be needed for the same reason set forth in the description of circuit 10 of FIG. 1.

According to the present invention, a charge saving transistor 134 is added to the prior art circuit 10 of FIG. 1. Charge-saving transistor 134 has an on state and an off state and is operably coupled to inverter 124 and ground 119 for preventing charge stored on output node 132 from discharging to ground 119. Additionally, output node 132 is coupled to a gate 115 of precharge control transistor 116 such that charge stored on output node 132 is fed back to dynamic node 118 when precharge control transistor 116 is set into its on state by the precharge signal. Charge-saving transistor 134 includes an input gate 136 coupled to precharge input 112 for receiving the precharge signal to prevent charge stored on output node 132 from discharging to ground 119 by setting the charge-saving transistor 134 into its off state.

Figure 3:
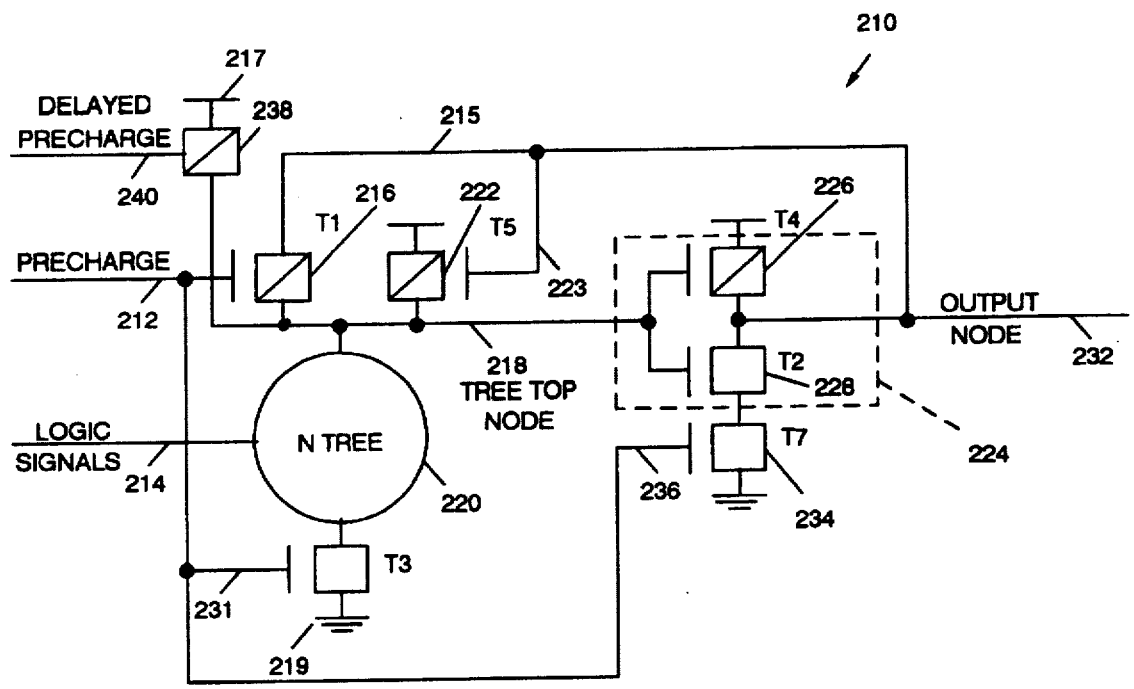
FIG. 3 is a circuit diagram of an alternative embodiment of a dynamic switching circuit according to the present invention.

Referring now to FIG. 3, an alternative embodiment of the invention is shown wherein like numerals indicate like or similar components. In this configuration, a charge-assist transistor 238 is added to the dynamic circuit 110 of FIG. 2. Charge-assist transistor 238 has an on state and an off state and is operably coupled to power supply 217 and dynamic node 218 for assisting precharge control transistor 216 with charging of dynamic node 218. Charge-assist transistor 238 includes a delayed precharge input 240 for receiving a delayed precharge signal that sets charge-assist transistor 238 into its on state at a predetermined time after the precharge signal sets precharge control transistor 216 into its on state. It will be appreciated that the use of charge-assist transistor 238 becomes necessary if dynamic node 218 is not brought up to the predefined voltage level prior to the start of the evaluate phase. It is to be understood that due to inherent charge sharing and power usage of circuit 210, the charge captured at output node 232 and returned to dynamic node 218 may not be able to bring dynamic node 218 up to its predefined voltage level. Thus, recharge transistor 222 and/or charge assist transistor 238 must provide the additional charge needed to bring the voltage at dynamic node 218 up to the predefined voltage level. It is to be noted that ground interrupt transistor 230 and/or charge assist transistor 238 may not be needed for the proper operation of dynamic circuit 210.

It will be appreciated that a plurality of dynamic switching circuits 110, 210 may be linked or cascaded such that the output node of each is coupled to the logic signal input of the succeeding dynamic circuit and wherein each of the precharge inputs are connected in parallel and each of the delayed precharge inputs are connected in parallel to thereby form a domino circuit array.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A dynamic switching circuit comprising:

a precharge control transistor having an on state and an off state and operably coupled to a dynamic node, said precharge control transistor including a precharge input for receiving a precharge signal that controls charging of said dynamic node to a predefined voltage level by setting said precharge control transistor into said on state wherein said dynamic node is charged;

a combinational logic circuit operably coupled to said dynamic node and ground for controlling discharge of the voltage from said dynamic node to ground, said combinational logic circuit including a logic signal input for receiving a logic signal that controls discharge of said dynamic node;

an inverter operably coupled to said dynamic node, a power supply, and an output node;

a charge saving transistor having an on state and an off state and operably coupled to said inverter and to ground for preventing charge stored on said output node from discharging to ground; and wherein said output node is coupled to said precharge control transistor such that charge stored on said output node is fed back to said dynamic node to charge said dynamic node when said precharge control transistor is set into said on state by said precharge signal.

2. The dynamic switching circuit as in claim 1, further comprising a recharge transistor having a conducting state and a non-conducting state and operably coupled to said power supply and said dynamic node for maintaining the voltage at said dynamic node at said predefined voltage level, said recharge transistor including a recharge control input coupled to said output node for receiving a recharge control signal that controls recharging of said dynamic node by setting said recharge transistor into said conducting state wherein said dynamic node is recharged by said power supply.

3. The dynamic switching circuit as in claim 1, wherein said charge saving transistor includes an input gate coupled to said precharge input for receiving said precharge signal to prevent charge stored on said output node from discharging to ground by setting said charge-saving transistor into said off state.

4. The dynamic switching circuit as in claim 1, further comprising a charge assist transistor having an on state and an off state and operably coupled to said power supply and said dynamic node for assisting said precharge control transistor with charging of said dynamic node.

5. The dynamic switching circuit as in claim 4 wherein said charge assist transistor includes a delayed precharge input for receiving a delayed precharge signal that sets said charge assist transistor into said on state a predetermined time after said precharge signal sets said precharge control transistor into said on state.

6. A dynamic switching circuit, comprising:

a precharge control transistor responsive to a precharge input signal for controlling charging of a dynamic node during a precharge interval;

a logic circuit operably coupled to said dynamic node for discharging said node;

an inverter operably coupled to said dynamic node, a power supply and an output node; and a charge saving transistor responsive to said precharge input signal and operably coupled to said inverter for substantially preventing discharge of charge stored on said output node, said output node being coupled to said precharge transistor so that charge stored on said output node charges said dynamic node during said precharge interval.

7. The dynamic switching circuit as in claim 6, further comprising a recharge transistor having a conducting state and a non-conducting state and operably coupled to said power supply and said dynamic node for maintaining the voltage at said dynamic node at a predefined voltage level, said recharge transistor including a recharge control input coupled to said output node for receiving a recharge control signal that controls recharging of said dynamic node by setting said recharge transistor into said conducting state wherein said dynamic node is recharged by said power supply.

8. The dynamic switching circuit as in claim 6, wherein said charge saving transistor includes an input gate for receiving said precharge input signal to prevent charge stored on said output node from discharging to ground by setting said charge-saving transistor into an off state.

9. The dynamic switching circuit as in claim 6, further comprising a charge assist transistor having an on state and an off state and operably coupled to said power supply and said dynamic node for assisting said precharge control transistor with charging of said dynamic node.

10. The dynamic switching circuit as in claim 9 wherein said charge assist transistor includes a delayed precharge input for receiving a delayed precharge signal that sets said charge assist transistor into said on state a predetermined time after said precharge input signal sets said precharge control transistor into an on state.

* * * * *